(12) United States Patent
Lilak et al.

(10) Patent No.: US 11,107,924 B2
(45) Date of Patent: Aug. 31, 2021

(54) SYSTEMS AND METHODS TO REDUCE FINFET GATE CAPACITANCE

(71) Applicant: INTEL CORPORATION, Santa Clara, CA (US)

(72) Inventors: Aaron D. Lilak, Beaverton, OR (US); Rishabh Mehandru, Portland, OR (US); Patrick Morrow, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 54 days.

(21) Appl. No.: 16/349,246

(22) PCT Filed: Dec. 29, 2016

(86) PCT No.: PCT/US2016/069245
§ 371 (c)(1),
(2) Date: May 10, 2019

(87) PCT Pub. No.: WO2018/125148
PCT Pub. Date: Jul. 5, 2018

(65) Prior Publication Data
US 2019/0348535 A1    Nov. 14, 2019

(51) Int. Cl.
*H01L 29/66* (2006.01)
*H01L 29/78* (2006.01)
*H01L 21/762* (2006.01)
*H01L 21/8238* (2006.01)
*H01L 27/092* (2006.01)

(52) U.S. Cl.
CPC .... *H01L 29/7851* (2013.01); *H01L 21/76224* (2013.01); *H01L 21/823814* (2013.01); *H01L 21/823821* (2013.01); *H01L 27/0924* (2013.01); *H01L 29/66795* (2013.01)

(58) Field of Classification Search
CPC .................................................. H01L 29/66795
See application file for complete search history.

(56) References Cited

U.S. PATENT DOCUMENTS

| 7,816,216 | B2 | 10/2010 | Ananthan |
| 8,785,284 | B1 | 7/2014 | Bergendahl et al. |
| 9,159,824 | B2 | 10/2015 | Lee et al. |
| 2014/0175515 | A1* | 6/2014 | Then ..................... H01L 29/772 257/194 |
| 2015/0214365 | A1 | 7/2015 | Xie et al. |
| 2015/0357440 | A1 | 12/2015 | Cheng et al. |
| 2016/0268426 | A1* | 9/2016 | Flachowsky .... H01L 21/823431 |

OTHER PUBLICATIONS

PCT/US2016/069245, International Search Report and Written Opinion, dated Aug. 31, 2017, 10 pages.

\* cited by examiner

*Primary Examiner* — Christopher A Johnson
(74) *Attorney, Agent, or Firm* — Schwabe, Williamson & Wyatt, P.C.

(57) ABSTRACT

The disclosure illustrates systems and methods for removing at least some excess gate material of a FinFET transistor. A FinFET transistor with the excess gate material removed may include a gate with a T-shaped cross-section. The narrower portion of the cross-section may be processed using backside wafer processing. The width of the narrower portion may be defined by a spacer.

20 Claims, 11 Drawing Sheets

SYSTEMS AND METHODS TO REDUCE FINFET GATE CAPACITANCE

RELATED APPLICATION(S)

This application is a national stage filing under 35 U.S.C. § 371 of International Patent Application No. PCT/US2016/069245, filed Dec. 29, 2016, which is hereby incorporated by reference herein in its entirety.

TECHNICAL FIELD

This disclosure generally relates to transistors. Specifically, this disclosure relates to reducing the gate capacitance of FinFET transistors.

BACKGROUND

Semiconductor integrated chips can be fabricated in a process that includes imaging, deposition and etching. Additional steps can include doping and cleaning. Wafers (such as mono-crystal silicon wafers, silicon on sapphire wafers or gallium arsenide wafers) can be used as a substrate. Photolithography can be used to mark areas of the wafer for enhancement through doping or deposition. An integrated circuit is composed of a plurality of layers that can include diffusion layers (which can include dopants), implant layers (which can include additional ions), metal layers (defining conduction) and/or via or contact layers (which can define conduction between layers).

DETAILED DESCRIPTION

Figure 1:
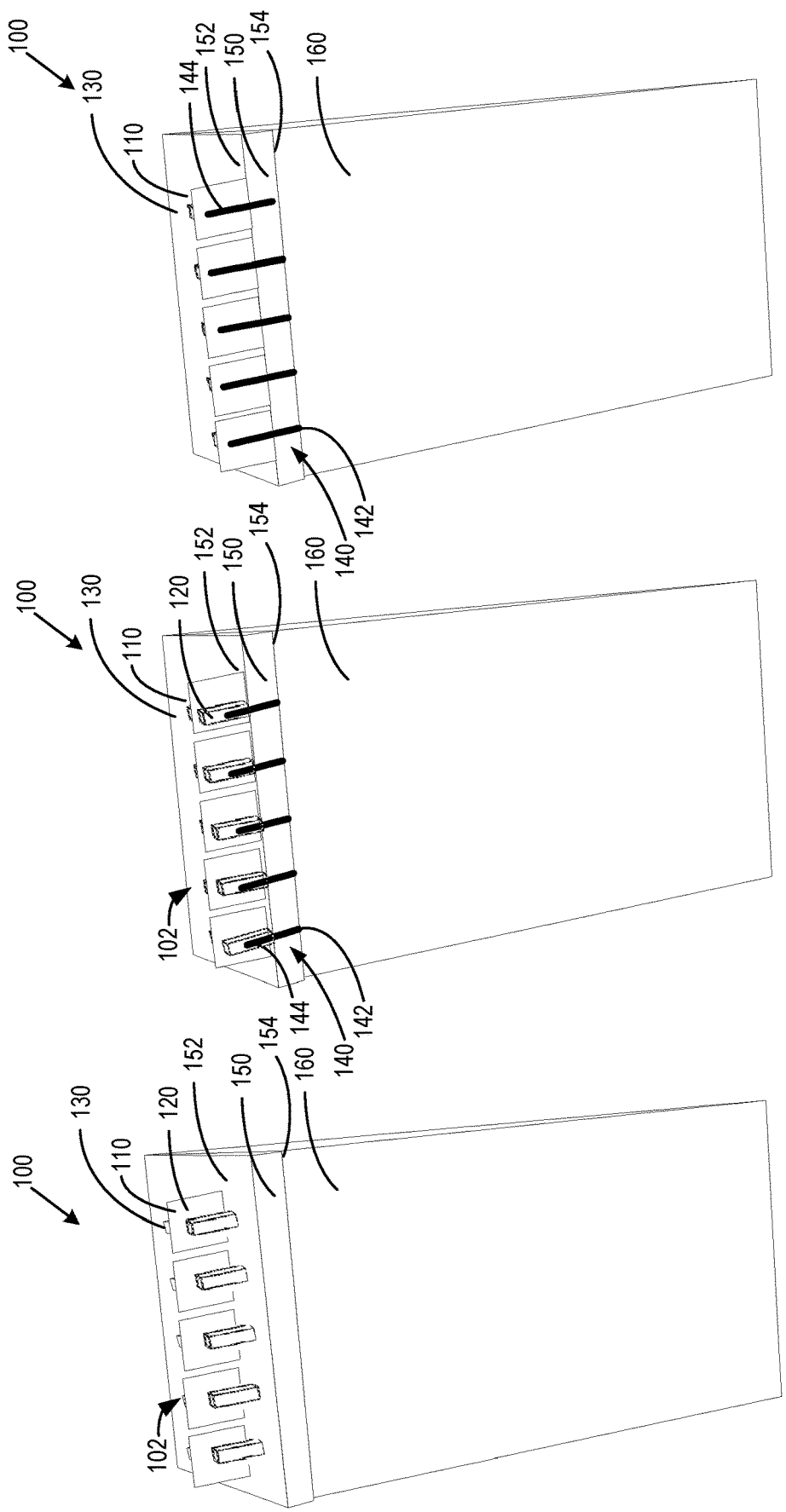
FIG. 1A is a simplified perspective view of a Fin Field Effect Transistor (FinFET) device.
FIG. 1B is a simplified perspective view of the FinFET device of FIG. 1A showing a cross-section taken through a source/drain region of the FinFET device.
FIG. 1C is a simplified perspective view of the FinFET device of FIG. 1A showing a cross-section taken through gates of the FinFET device.

FinFET transistors with a portion of the transistor's gate material removed and methods to manufacture such FinFET transistors are described herein. A transistor may include a source region and a drain region located on a first side of a substrate. A semiconductor fin may couple the source region to the drain region. The semiconductor fin may have a first portion located near the first side of the dielectric layer and a second portion located near a second side of the dielectric layer. The first and the second sides of the substrate may be opposite each other. A spacer may at least partially surround the second portion of the semiconductor fin and extend away from the semiconductor fin a first distance.

A gate region may at least partially surround the first portion of the semiconductor fin. The gate region may have a T-shaped cross-section with a wider portion and a narrower portion. The wider portion of the gate region may be located nearer an end of the first portion of the semiconductor fin than the narrower portion. The narrower portion may extend away from the semiconductor fin the first distance as defined by the spacer, and the wider portion may extend away from the semiconductor fin further than the first distance.

Described herein are systems and methods for removing at least some of the excess gate material of a Fin Field Effect Transistor (FinFET) through backside wafer processing. Removing the excess gate material may reduce gate capacitance, reduce power consumption, and increase transistor switching rates. In the following description, various aspects of the illustrative implementations will be described using terms commonly employed by those skilled in the art to convey the substance of their work to others skilled in the art. However, it will be apparent to those skilled in the art that the disclosure may be practiced with only some of the described aspects. For purposes of explanation, specific numbers, materials and configurations are set forth in order to provide a thorough understanding of the illustrative implementations. However, it will be apparent to one skilled in the art that the disclosure may be practiced without the specific details. In other instances, well-known features are omitted or simplified in order not to obscure the illustrative implementations.

Various operations will be described as multiple discrete operations, in turn, in a manner that is most helpful in understanding the disclosure; however, the order of description should not be construed to imply that these operations are necessarily order dependent. In particular, these operations need not be performed in the order of presentation.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening layers.

Some embodiments may be formed or carried out on a substrate, such as a semiconductor substrate. In one embodiment, the semiconductor substrate may be a crystalline substrate formed using a bulk silicon or a silicon-on-insulator substructure. In other embodiments, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. In other embodiments, a substrate may include dielectric materials. Although a few examples of materials from which the substrate may be formed are described here, any material that may serve as a foundation upon which a semiconductor device may be built falls within the spirit and scope of the disclosure.

A plurality of transistors, such as metal-oxide-semiconductor field-effect transistors (MOSFET or simply MOS transistors), may be fabricated on the substrate. In various embodiments, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the disclosure may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may include at least one P-type workfunction metal or N-type workfunction metal, depending on whether the transistor is to be a PMOS or an NMOS transistor. In some implementations, the gate electrode layer may include a stack of two or more metal layers, where one or more metal layers are workfunction metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some embodiments, when viewed as a cross-section of the transistor along the source-channel-drain direction, the gate electrode may include a "U"-shaped structure that includes a bottom portion substantially parallel to the surface of the substrate and two sidewall portions that are substantially perpendicular to the top surface of the substrate. In another embodiment, at least one of the metal layers that form the gate electrode may simply be a planar layer that is substantially parallel to the top surface of the substrate and does not include sidewall portions substantially perpendicular to the top surface of the substrate. In further embodiments, the gate electrode may include a combination of U-shaped structures and planar, non-U-shaped structures. For example, the gate electrode may include one or more U-shaped metal layers formed atop one or more planar, non-U-shaped layers.

In some embodiments, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In an alternate embodiment, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some embodiments, the source and drain regions may be fabricated using a silicon alloy such as silicon germanium or silicon carbide. In some embodiments epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Additional details and examples are provided with reference to the figures below. The embodiments of the disclosure can be understood by reference to the drawings, wherein like parts are designated by like numerals throughout. The components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments.

FIG. 1A is a simplified perspective view of a FinFET device 100. As shown, the FinFET device 100 includes a plurality of transistors 102 on a first side 152 of a dielectric gap fill 150. The transistors 102 include a gate 110, a source/drain region 120, and a source/drain region 130. The material comprising the source/drain regions 120 and 130, in some embodiments, may be epitaxially deposited atop the fin material 140. For example, an epitaxial silicon-germanium region deposited atop a silicon fin. In other embodiments, the regions 120 and 130 may be formed directly from the fin material 140. The gate 110 is configured to control the current between the source/drain region 120 and the drain/source region 130. The transistors 102 may be formed on the first side 152 of the dielectric gap fill 150 using standard front-side substrate processing techniques. The dielectric gap fill 150 may have been deposited on a substrate 160, such as a silicon wafer, with a second side 154 of the dielectric gap fill 150 in contact with the substrate 160.

FIG. 1B is a simplified perspective view of the FinFET device 100 of FIG. 1A showing a cross-section taken through a source/drain region 120 of the FinFET device 100. As shown, the source/drain region 120 surround a first portion 144 of a fin 140. The fin 140 includes a semiconductor region that couples the source/drain region 120 to the drain region 130. As shown, the fin 140 includes the first portion 144 and a sub-fin 142 separated by the first side 152 of the dielectric gap fill 150. A cross-sectional view of the drain region 130 would reveal a similar structure to the cross-sectional view of the source/drain region 120 shown in FIG. 1B.

FIG. 1C is a simplified perspective view of the FinFET device 100 of FIG. 1A showing a cross-section taken through gates 110 of the FinFET device 100. As shown, the gates 110 at least partially surround a distal portion of the fins 140. As illustrated in the example of FIG. 1C, in some embodiments the fin 140 may maintain a rectangular cross-section as it extends through the source/drain region 120, the gate 110, and the drain region 130. In some embodiments, the fins 140 may be rectangular, trapezoidal, nonrectangular, ribbonized, etched into a nanowire structure, some other shape, or combinations thereof.

Figure 2:
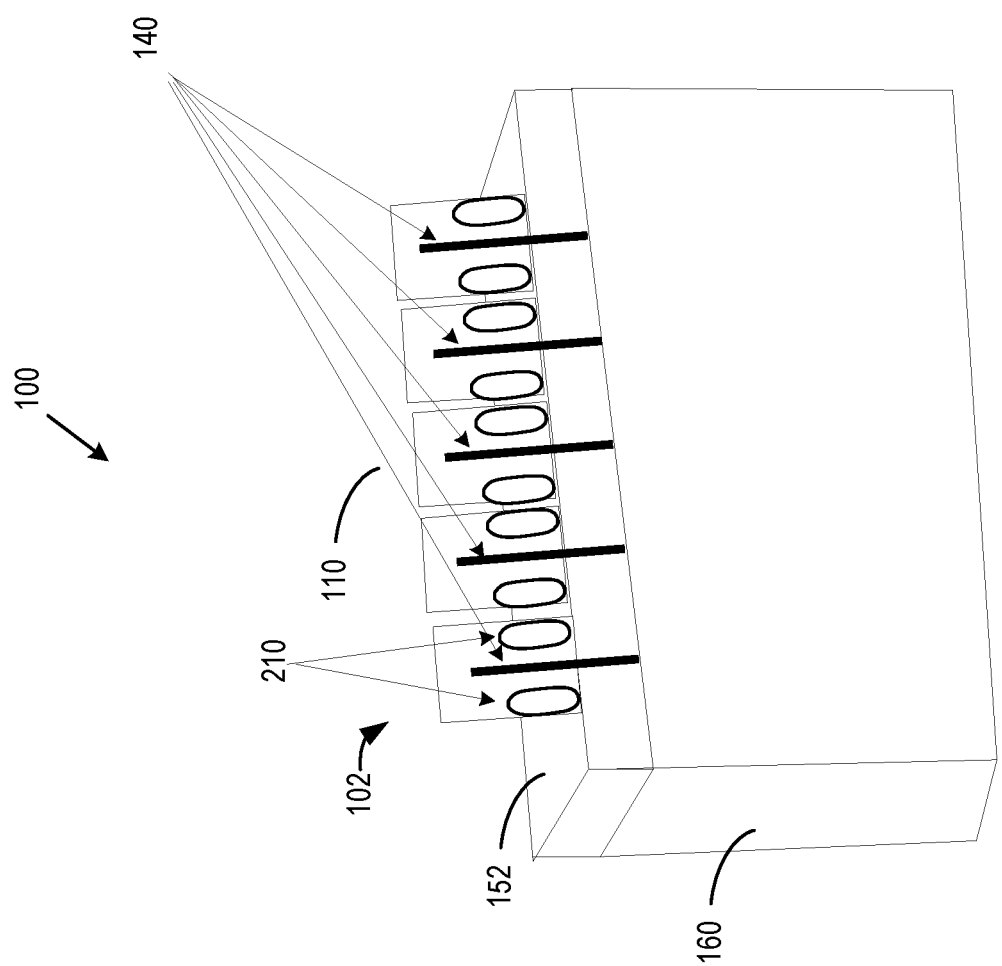
FIG. 2 is a simplified perspective view of the FinFET device of FIG. 1A with a cross-section taken through the gates of the FinFET device and identifying excess gate material.

FIG. 2 is a simplified perspective view of the FinFET device 100 of FIG. 1A with a cross-section taken through the gates 110 of the FinFET device and identifying excess gate material 210. The processing (e.g., etching, depositing, doping, etc.) of the first side 152 of the of the dielectric gap fill 150 to create the FinFET transistor 102 results in excess gate material 210 surrounding the fins 140. The excess gate material 210 is not required for the operation of the FinFET device 100. In some embodiments, a contact may be deposited atop the source and drain/regions 120 and 130 resulting in excess metal deposition around the source/drain regions 120 and 130 similar to the excess gate material 210. While the following figures discuss removal of the excess gate material 210, similar methods may be performed to remove the excess deposition surrounding the source/draing regions 120 and 130.

Moreover, the excess gate material 210 results in a parasitic gate capacitance that limits the performance of the transistor 102. For instance, the excess gate material 210 causes a source to gate capacitance, a drain to gate capacitance, and a gate to gate capacitance. Removal of the excess gate material 210 may reduce the surface area between the gates 110 and the source/drain regions. By reducing the surface area, the gate capacitance may be significantly reduced. Reducing the capacitance results in faster switching times and lower energy consumption. FIGS. 3-8 illustrate a process to remove the excess gate material 210 to reduce gate capacitance and improve the performance of the FinFET device 100.

Figure 3:
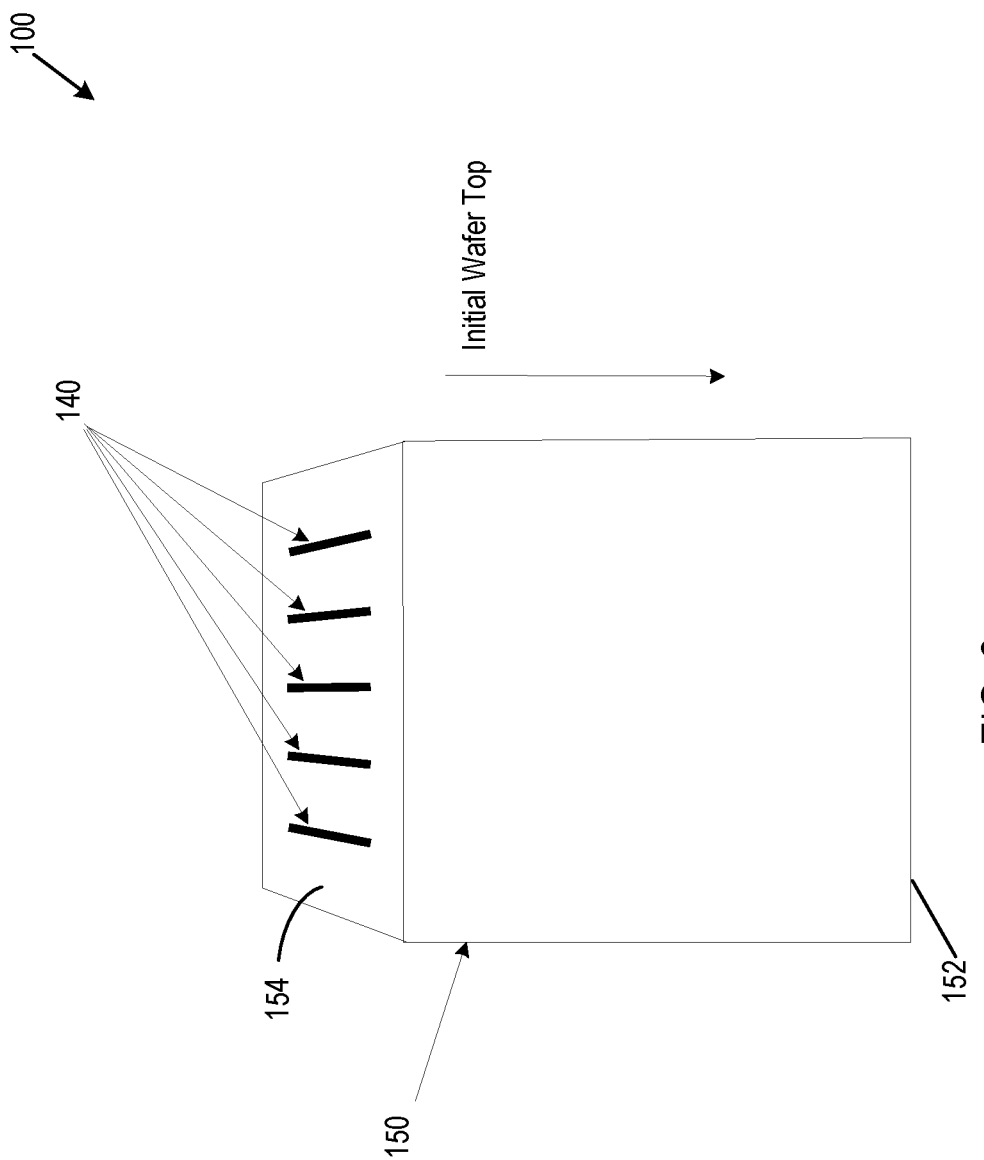
FIG. 3 is a simplified perspective view of the FinFET device of FIG. 2 showing a backside of the FinFET device with the semiconductor substrate removed.

FIG. 3 is a simplified perspective view of the FinFET device 100 of FIG. 2 showing a backside of the FinFET device with the semiconductor substrate removed. As shown in FIG. 3, the FinFET device 100 has been rotated from FIGS. 1 and 2, so the first side 152 is now at the bottom and the second side 154 is now at the top. After the desired front-side processing is performed to the FinFET device 100 to create the FinFET transistors, a backside reveal process may remove the substrate of the FinFET device 100.

The backside reveal process may include stabilizing the first side 152 of the FinFET device 100 and removing the substrate. In some embodiments the FinFET device 100 may be stabilized by bonding the first side 152 to a carrier wafer. In other embodiments, additional dielectric gap fill 150 may surround the transistor gates for stability. Chemical and/or mechanical techniques may be used to remove the substrate. For example, the backside removal process may be a timed chemical etch that removes the substrate and leaves the dielectric gap fill 150. After the backside reveal process is complete, the FinFET device 100 may appear as shown in FIG. 3. In some embodiments, the removal of the substrate may leave the bottom of the fins 140 exposed. Thus, in this exemplary embodiment, the sub-fin portion (i.e., proximal side) of the fins 140 are be flush with the second side 154 of the dielectric gap fill 150.

Figure 4:
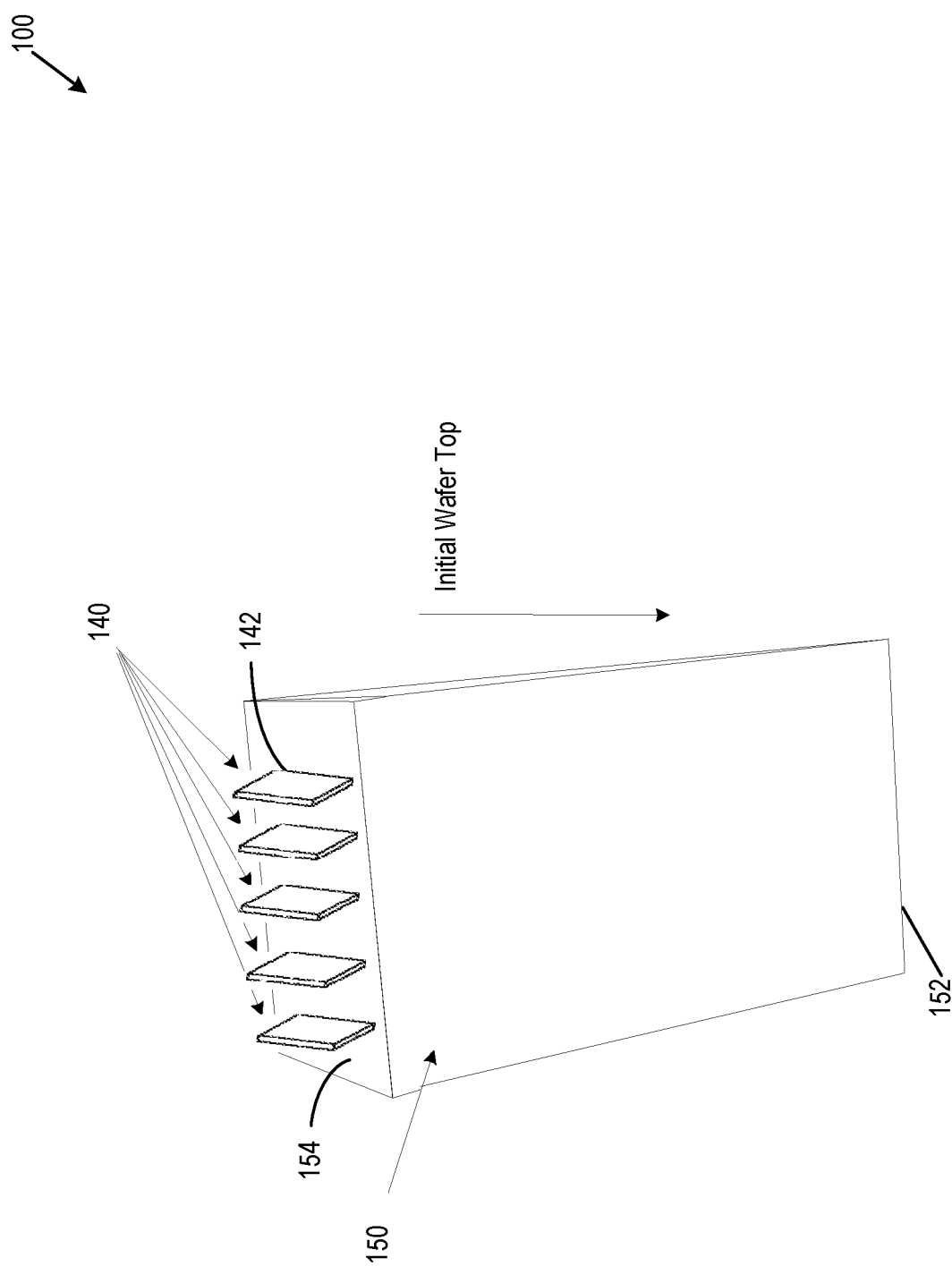
FIG. 4 is a simplified perspective view of the FinFET device of FIG. 3 showing the backside of the FinFET device with a dielectric gap fill partially recessed along a second side to expose sub-fins.

FIG. 4 is a simplified perspective view of the FinFET device 100 of FIG. 3 showing the backside of the FinFET device with a dielectric gap fill 150 partially recessed along a second side 154 to expose sub-fins 142. The FinFET device 100 in FIG. 4 is in the same orientation as in FIG. 3. That is, the FinFET device 100 has been rotated from FIGS. 1 and 2, so the first side 152 is now at the bottom and the second side 154 is now at the top.

An etching process may be used to recess the second side 154 of the dielectric gap fill 150. The etching process may be dry or wet. To limit etching to the dielectric gap fill 150, a mask may be used to protect the fins 140. In some embodiments, the etching agent may only react to contact with the dielectric gap fill 150.

As shown, the etching process exposes the sub-fins 142 (i.e., the proximal portions of the fins 140). The sub-fins 142 form a series of stubs protruding from the second side 154 of the dielectric gap fill 150. Of course, the terms "proximal" and "distal" are relative terms. As a result, since the original proximal portions (i.e., sub-fins 142) have been exposed and the original distal portion of the fins 140 has been covered for stability, the terminology may be reversed when discussing the backside processing, without departing from the spirit of the embodiments disclosed herein. For instance, the original distal portion may be referred to as the new proximal portion, and the original proximal portion may be referred to as the new distal portion.

In some embodiments, the etching process continues until at least a portion of the gates are exposed. In other embodiments, the etch is continued until the recessed portion of the second side 154 is within a target distance from the gates. To reach the target distance, a timed etch may be used. Additionally or alternatively, the dielectric gap fill 150 may comprise two different layers to assist in etching to the target distance. In some embodiments, the two layers may be different materials—a first layer that is etch resistant near the gates (e.g., at the target distance) and a second layer that is etchable near the sub-fins 142. In some embodiments, an etch-resistant ribbon may be located at the target distance and separate the two layers.

Figure 5:
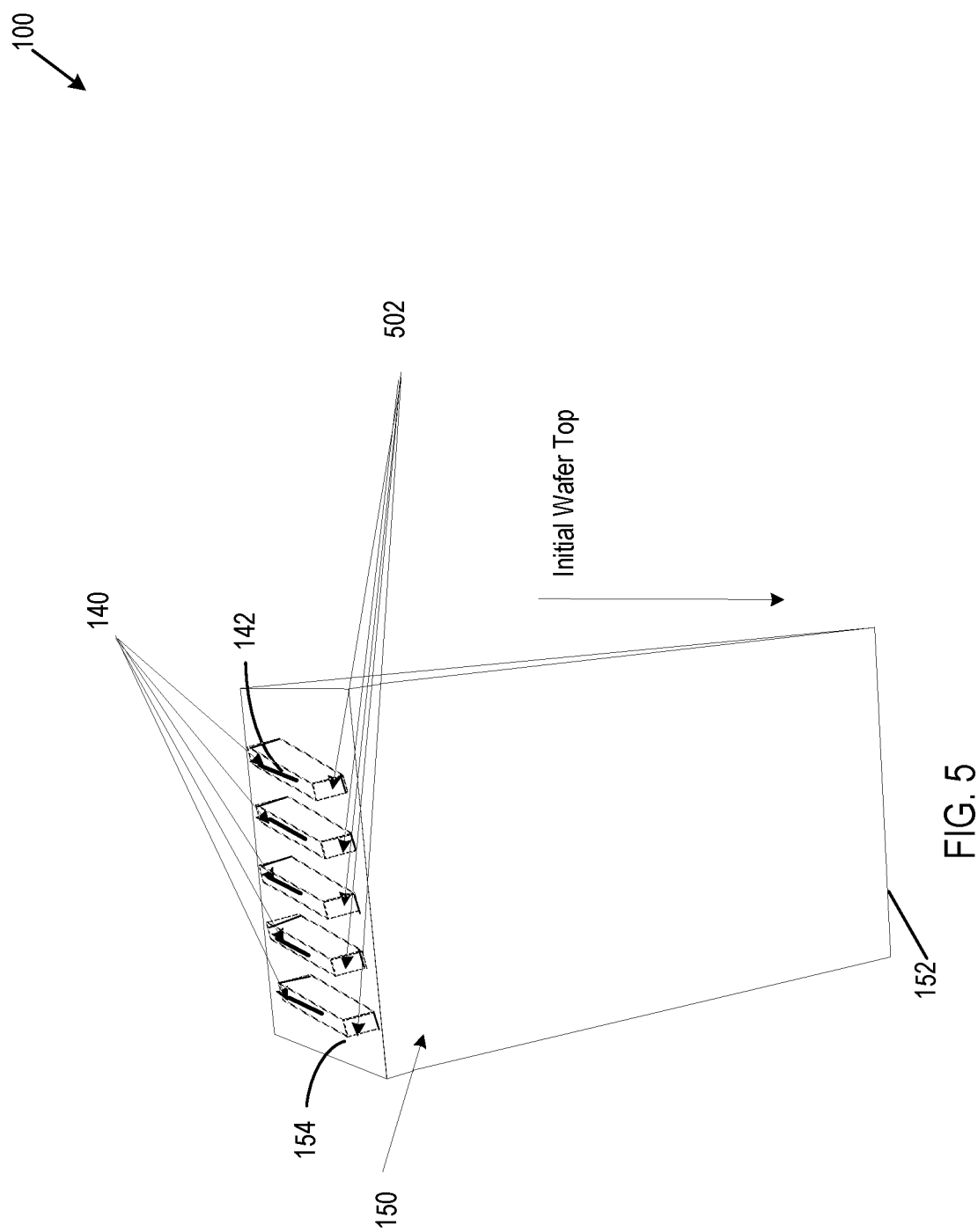
FIG. 5 is a simplified perspective view of the FinFET device of FIG. 4 showing the backside of the FinFET device with the dielectric gap fill partially recessed along the second side and spacers surrounding the sub-fins.

FIG. 5 is a simplified perspective view of the FinFET device 100 of FIG. 4 showing the backside of the FinFET device 100 with the dielectric gap fill 150 partially recessed along the second side 154 and spacers 502 surrounding the sub-fins 142. The FinFET device 100 in FIG. 5 is in the same orientation as in FIG. 4. That is, the FinFET device 100 has been rotated from FIGS. 1 and 2, so the first side 152 is now at the bottom and the second side 154 is now at the top.

The spacers 502 at least partially surround the sub-fin 142 of the fins 140. An isotropic deposition and a dry-etch process may form the spacers 502. In some embodiments, the spacers 502 include an etch-resistant material. For example, the spacers 502 may be silicon nitride, silicon carbide, or other similar materials. The material may be selected based on the etch chemistry of subsequent etches (e.g., the etch that creates FIG. 6).

Figure 6:
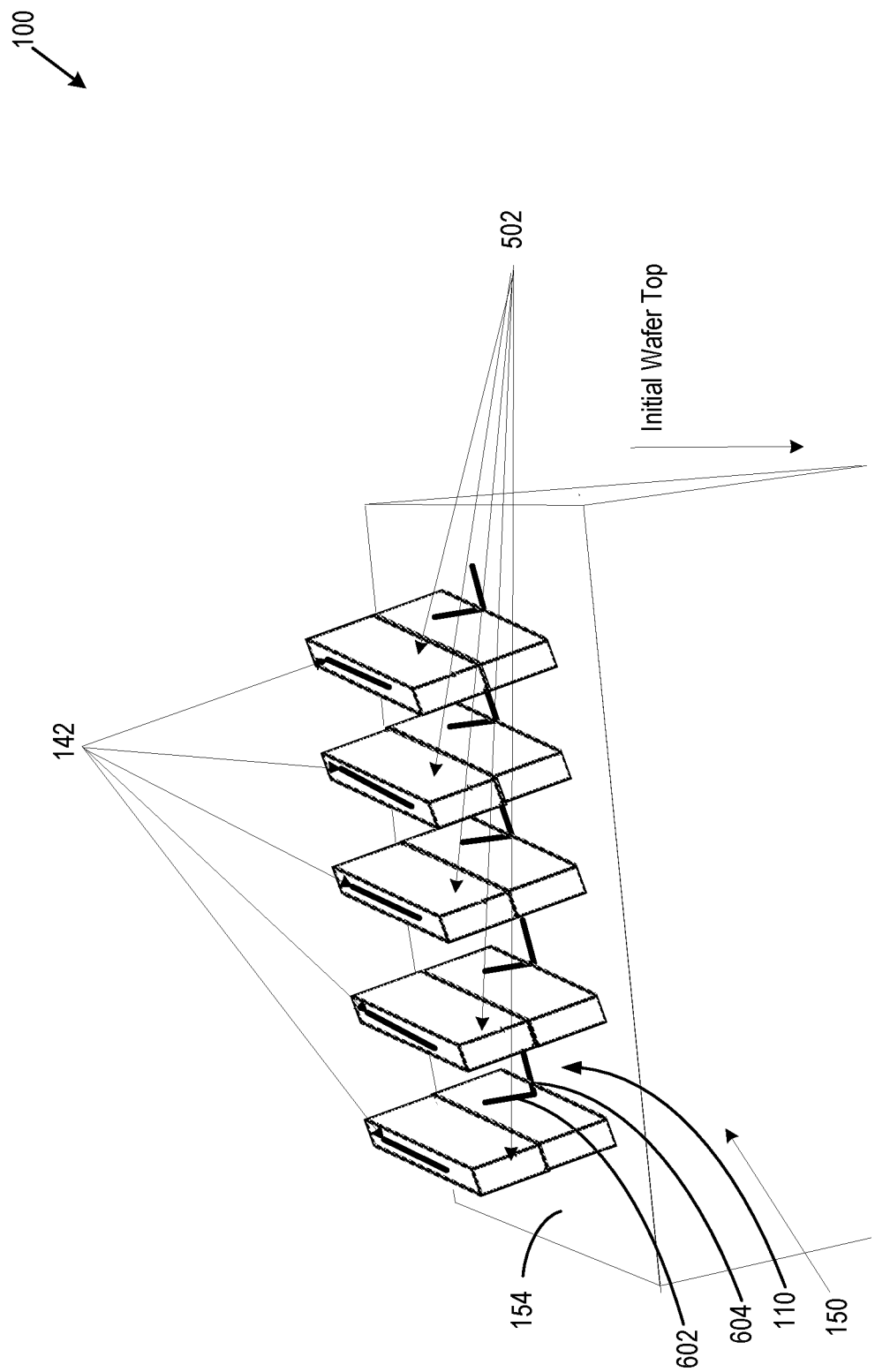
FIG. 6 is a simplified perspective view of the FinFET device of FIG. 5 showing the backside of the FinFET device with the spacers surrounding the sub-fins after a second etch.

Each spacer 502 extends away from each corresponding fin 140 a set distance. This distance defines the width of a desired portion of the gate. For example, FIG. 2 identified the excess gate material 210. The spacers 502 may extend away from the fins 140 up to the location of the excess gate material. In some embodiments, the spacer 502 may extend between three and 10 nanometers. The spacers 502 define an offset and determine the amount of gate material to be removed in subsequent etches (e.g., the etch that removes portions of the gates 110, as illustrated in FIG. 6). The spacers 502 protect the fins 140 from subsequent etches and physical stresses.

FIG. 6 is a simplified perspective view of the FinFET device 100 of FIG. 5 showing the backside of the FinFET device 100 with the spacers 502 surrounding the sub-fins 142 after a second etch. The FinFET device 100 in FIG. 6 is in the same orientation as in FIG. 5. That is, the FinFET device 100 has been rotated from FIGS. 1 and 2, so the first side is now at the bottom and the second side 154 is now at the top. As shown, the second etch may recess the second side 154 and a portion of the gate 110. The second etch may be wet or dry and timed or untimed.

The amount of gate 110 removed by the second etch is defined based on the spacers 502 and the length of the second etch. For example, if the spacers 502 extend out from the sub-fins 142 by three nanometers, portions of the gate 110 within about three nanometers of the fin will not be removed because the spacers 502 mask these portions of the gate 110 from the second etch. Further, the length of the etch determines the depth of the etch of the gate 110.

The second etch may be timed to etch to a target gate depth. In some embodiments, the target gate depth may be at or near the original distal end of the fin (i.e., the portion of the fin shown extending out of the first side 152 of the dielectric gap fill 150 in FIGS. 1A-1C). The timed etch results in a gate 110 with two widths, a narrower portion 602 closer to the spacer 502 and a wider portion 604 where the gate 110 was not affected by the second etch. The width of the narrower portion 602 is defined by the spacers 502. The two widths cause the gate 110 to have a T-shaped cross-section (as perhaps best shown in FIG. 8).

The FinFET device 100 may be subjected to a low-temperature anneal in hydrogen or deuterium ambient. This reduces any surface fixed charge that may have been introduced with the etch process. In some embodiments, the region voided from the dielectric gap fill 150 by the first and second etch may be left as an air gap. In some embodiments, the second side 154 may be refilled to strengthen the FinFET device 100.

Figure 7:
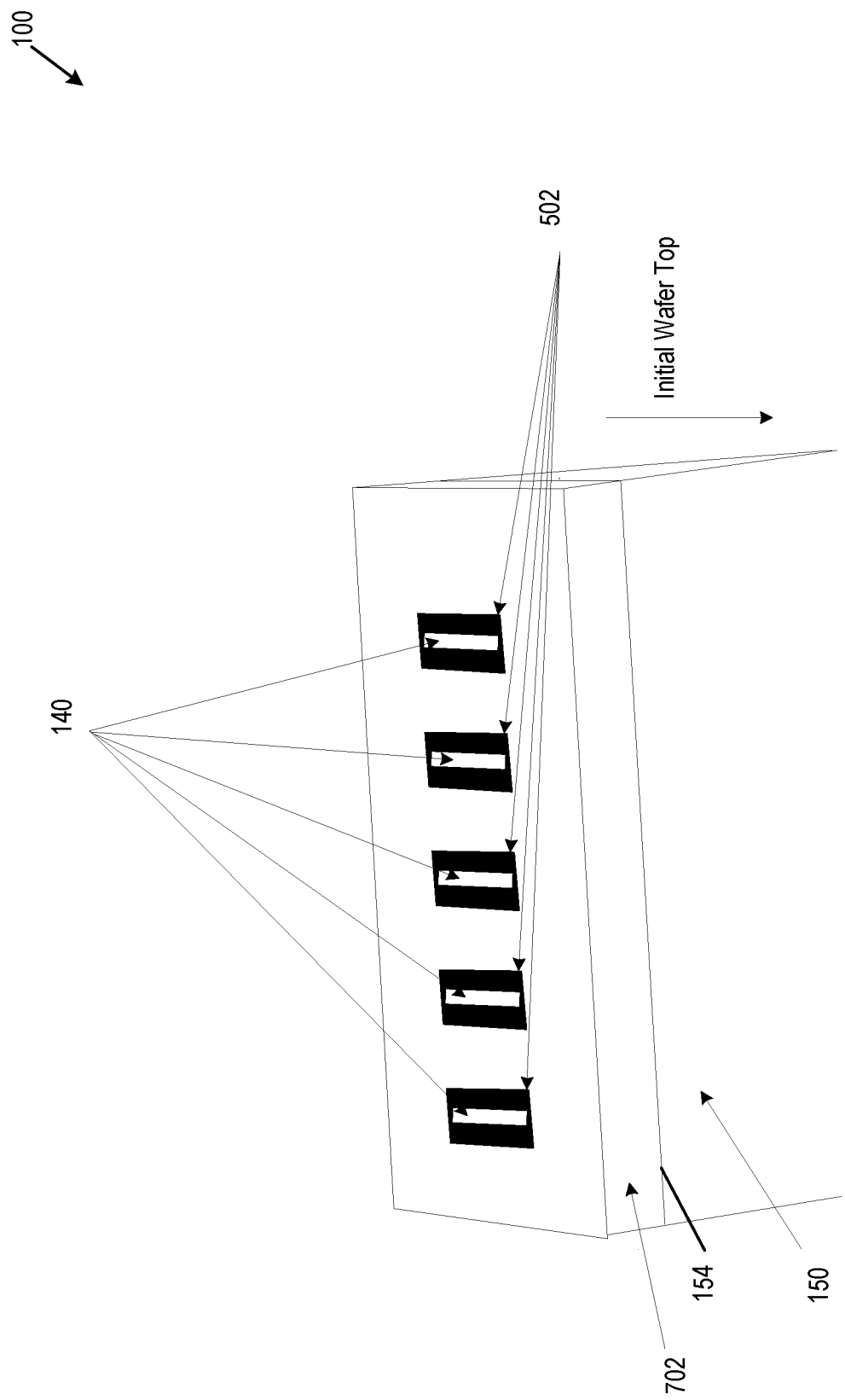
FIG. 7 is a simplified perspective view of the FinFET device of FIG. 6 showing the backside of the FinFET device with spacers and T-shaped gates after a replanarization process.

FIG. 7 is a simplified perspective view of the FinFET device 100 of FIG. 6 showing the backside of the FinFET device 100 with spacers 502 and T-shaped gates after a replanarization process. The FinFET device 100 in FIG. 7 is in the same orientation as in FIG. 6. That is, the FinFET device 100 has been rotated from FIGS. 1 and 2, so the first side is now at the bottom and the second side 154 is now at the top. In the embodiment illustrated in FIG. 7, the FinFET device 100 is filled and planarized to increase mechanical stability.

A dielectric 702 (e.g., a flowable dielectric) is deposited on the second side 154 of the dielectric gap fill 150. The dielectric 702 fills the areas removed by the previous etches. The dielectric 702 may be a flowable oxide, other oxide, other gap-fill dielectric, other material, or combinations thereof. Additionally, the dielectric 702 may be a low-k material such as a porous oxide or fluorinated oxide to reduce capacitance between gates. A chemical mechanical polish and process may planarize the backside of the FinFET device 100.

Figure 8:
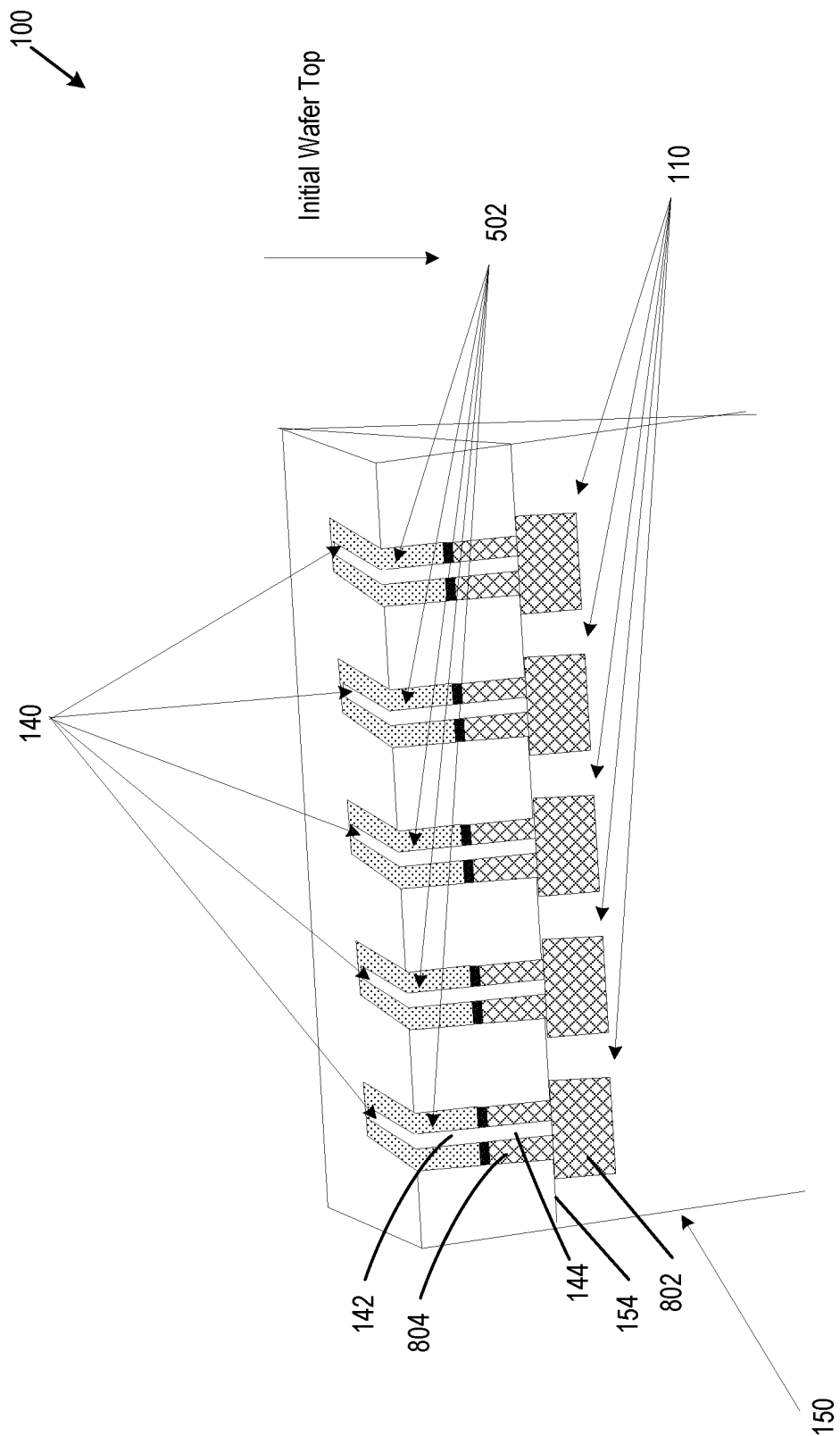
FIG. 8 is a simplified perspective view of the FinFET device of FIG. 7 with the excess gate material removed, according to some embodiments.

FIG. 8 is a simplified perspective view of the FinFET device 100 of FIG. 7 with the excess gate material removed, according to some embodiments. The backside processing detailed in FIGS. 3-7 may be implemented to the FinFET device 100 shown in FIG. 2 to remove the excess gate material to create the FinFET device 100 shown in FIG. 8. The FinFET device 100 in FIG. 8 is in the same orientation as in FIG. 7. That is, the FinFET device 100 has been rotated from FIGS. 1 and 2, so the first side is now at the bottom and the second side 154 of the dielectric gap fill 150 is now at the top.

The backside processing results in the T-shaped gates 110 and the spacers 502. The spacers 502 at least partially surround the sub-fins 142 and extend away from the semiconductor fin 140 a first distance. The gates 110 at least partially surround a first portion 144 of the semiconductor fin 140. The gates 110 have a T-shaped cross-section with a wider portion 802 and a narrower portion 804. The wider portion 802 of the gates 110 is located nearer an end of the first portion 144 of the semiconductor fin 140 than the narrower portion 804. By way of non-limiting example, as shown the wider portion 802 is contiguous with the end of the first portion 144 of the semiconductor fin 140.

The spacers 502 define the width of the narrower portion 804 of the gates 110. For instance, as shown, the narrower portion 804 extends out from the semiconductor fin 140 the first distance as defined by the spacers 502, and the wider portion 802 extends out from the semiconductor fin 140 further than the first distance. This T-shaped configuration may allow the FinFET transistors to be controlled and limit the gate capacitance.

The T-shaped transistors formed by removing excess gate material may be used in various computing device components. For example, the T-shaped transistors may be used in a processor, memory unit, graphics processing unit, antenna, display, battery, power amplifier, and voltage regulator.

A FinFET device 100 with the excess gate material removed may improve the performance of a computing device. A computing device may include one or more transistors with a source region and a drain region on a first side of a substrate such as dielectric gap fill 150. A semiconductor region may be configured as a channel coupling the source electrode to the drain electrode. As shown, the semiconductor region may form a fin 140 with a distal portion (i.e., the first portion 144) near the first side of the substrate and a proximal portion (i.e., the sub-fin 142) near the second side of the substrate, wherein the first and the second sides of the substrate are opposite each other. An electrically conductive material may form the gate 110 and at least partially surround the distal portion of the semiconductor region, the electrically conductive material having a first section (i.e., the wider portion 802) and a second section (i.e., the narrower portion 804). The first section may be located nearer an end of the distal portion of the semiconductor region than the second section. Further, the first section may extend away from the semiconductor region further than the second section.

Figure 9:
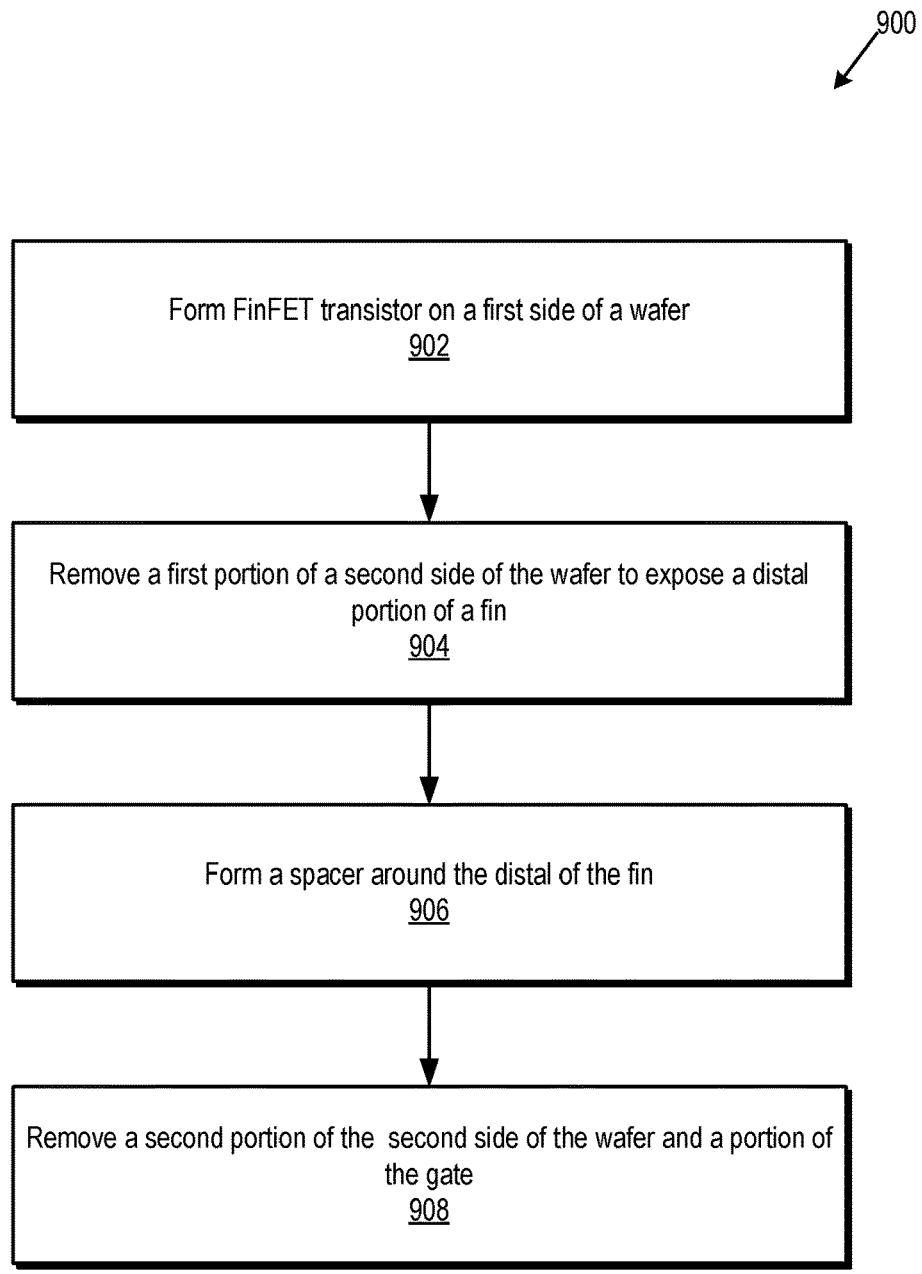
FIG. 9 illustrates a simplified flow diagram illustrating a method for removing excess gate material of a FinFET transistor.

FIG. 9 illustrates a simplified flow diagram illustrating a method 900 for removing excess gate material on a FinFET transistor. The method 900 includes forming 902 at least one FinFET transistor on a first side of a wafer. The FinFET transistor may include a source, a drain, a fin, and a gate. The gate may at least partially surround the fin at a proximal portion and extend away from the fin a first distance. The FinFET transistor may be formed using standard front-side wafer processing techniques.

The method 900 also includes removing 904 a first portion of a second side of the wafer to expose a distal portion of a fin of the FinFET transistor. By way of non-limiting example, removing 904 may include using a backside reveal process to remove the first portion of the second side of the wafer. The first and the second sides of the substrate may be opposite each other. The backside reveal process may include strengthening the first side of the wafer. To strengthen the first side of the wafer, additional gap fill dielectric may be added to the first side and/or the wafer may be coupled to a carrier wafer. The first portion may be removed via physical or chemical process. For example, a timed etch may remove the first portion.

The method 900 further includes forming 906 a spacer around the distal portion of the fin. By way of non-limiting example, forming 906 may include using an isotropic deposition and a dry-etch process to form the spacer. The spacer may extend out from the fin a second distance. In some embodiments, the second distance is less than the first distance. The spacer may be an etch-resistant material such as silicon nitride or silicon carbide.

The method 900 also includes removing 908 a second portion of the second side of the wafer and a portion of the gate. By way of non-limiting example, removing 908 may include using a dry etch to remove the second portion of the second side of the wafer and the portion of the gate. The portion of the gate removed may be defined by the spacers up to the end of the proximal portion of the fin. This may cause the gate to have a T-shaped cross-section with a wider section at and above the proximal end of the fin.

Figure 10:
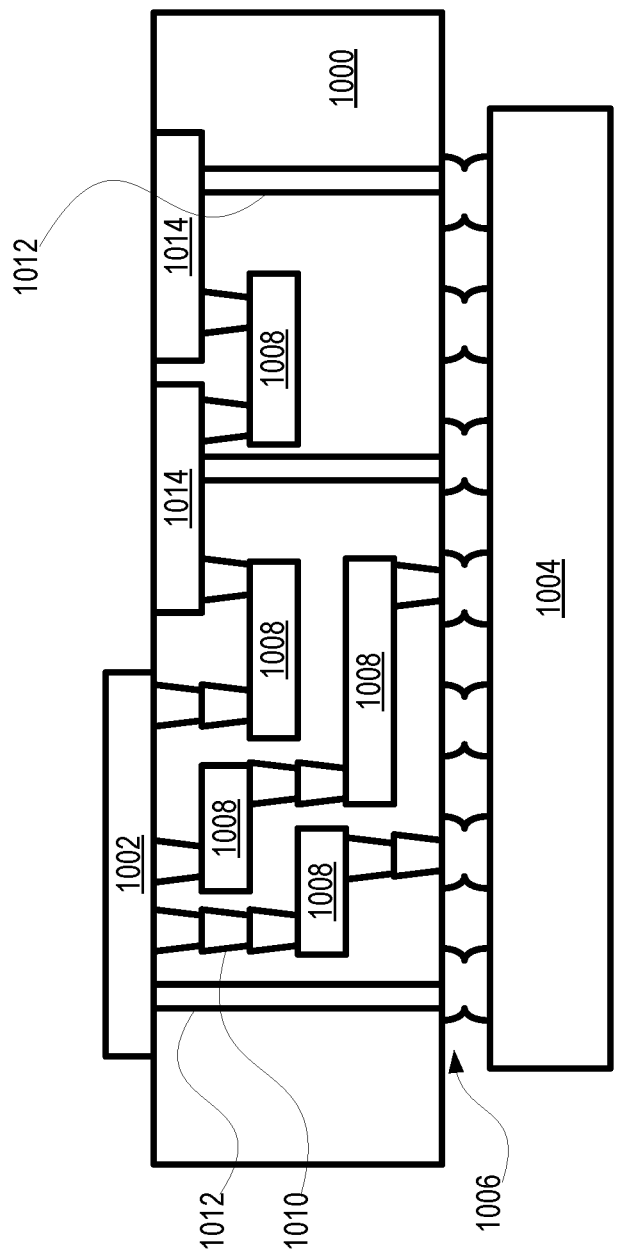
FIG. 10 is an interposer implementing one or more embodiments of the disclosure.

FIG. 10 illustrates an interposer 1000 implementing one or more embodiments of the disclosure. The interposer 1000 is an intervening substrate used to bridge a first substrate 1002 to a second substrate 1004. The first substrate 1002 may be, for instance, an integrated circuit die. The second substrate 1004 may be, for instance, a memory module, a computer motherboard, or another integrated circuit die. Generally, the purpose of the interposer 1000 is to spread a connection to a wider pitch or to reroute a connection to a different connection. For example, the interposer 1000 may couple an integrated circuit die to a ball grid array (BGA) 1006 that can subsequently be coupled to the second substrate 1004. In some embodiments, the first and second substrates 1002/1004 are attached to opposing sides of the interposer 1000. In other embodiments, the first and second substrates 1002/1004 are attached to the same side of the interposer 1000. And in further embodiments, three or more substrates are interconnected by way of the interposer 1000.

The interposer 1000 may be formed of an epoxy resin, a fiberglass-reinforced epoxy resin, a ceramic material, or a polymer material such as polyimide. In further implementations, the interposer 1000 may be formed of alternate rigid or flexible materials that may include the same materials described above for use in a semiconductor substrate, such as silicon, germanium, and other group III-V and group IV materials.

The interposer 1000 may include metal interconnects 1008 and vias 1010, including but not limited to through-silicon vias (TSVs) 1012. The interposer 1000 may further include embedded devices 1014, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1000.

Some embodiments, apparatuses or processes disclosed herein may be used in the fabrication of the interposer 1000.

Figure 11:
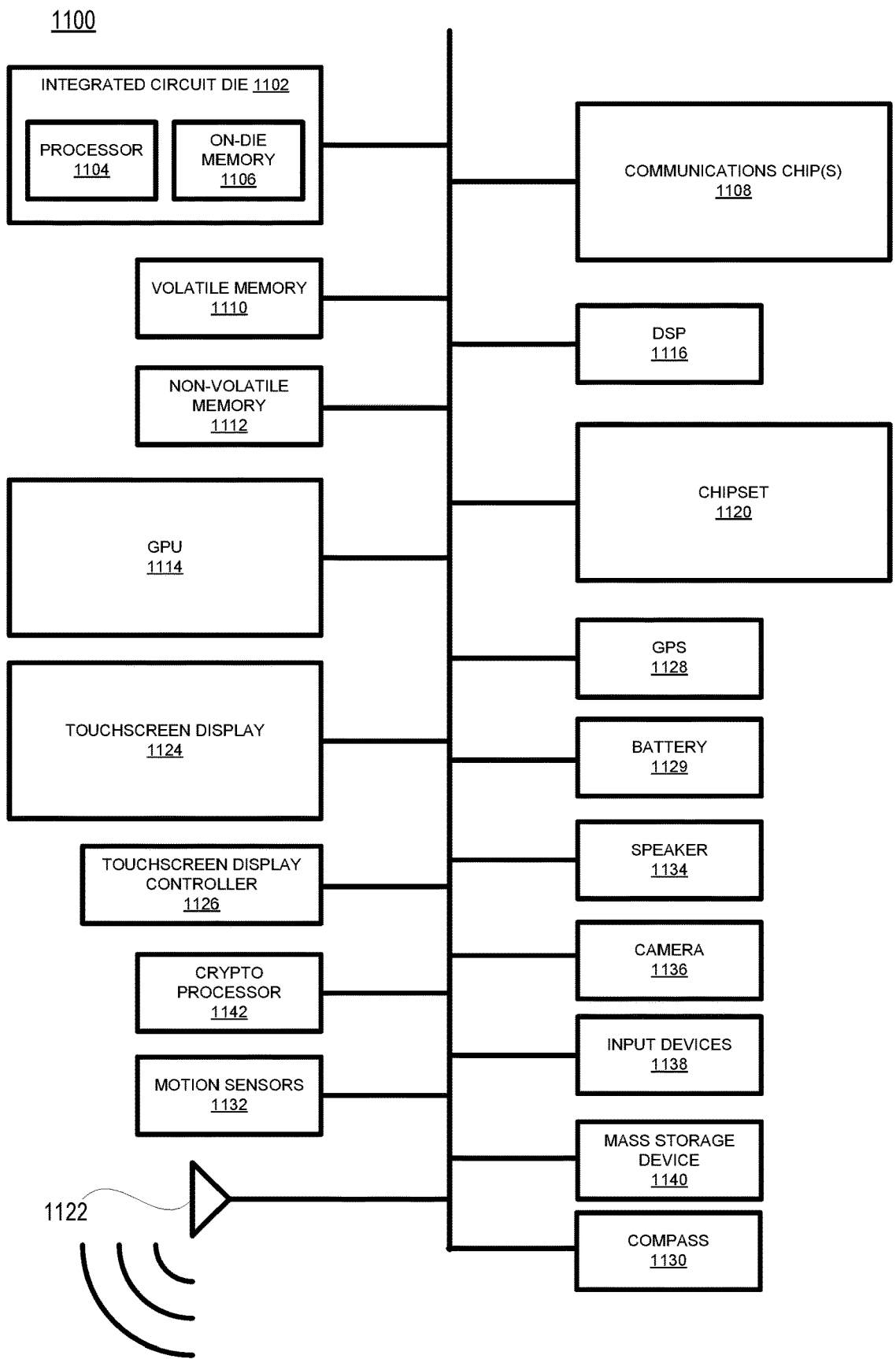
FIG. 11 is a computing device built in accordance with an embodiment of the disclosure.

FIG. 11 illustrates a computing device 1100 in accordance with an embodiment of the disclosure. The computing device 1100 may include a number of components. In one embodiment, these components are attached to one or more motherboards. In an alternate embodiment, some or all of these components are fabricated onto a single system-on-a-chip (SoC) die, such as an SoC used for mobile devices. The components in the computing device 1100 include, but are not limited to, an integrated circuit die 1102 and at least one communications logic unit 1108. In some implementations the communications logic unit 1108 is fabricated within the integrated circuit die 1102 while in other implementations the communications logic unit 1108 is fabricated in a separate integrated circuit chip that may be bonded to a substrate or motherboard that is shared with or electronically coupled to the integrated circuit die 1102. The integrated circuit die 1102 may include a CPU 1104 as well as on-die memory 1106, often used as cache memory, that can be provided by technologies such as embedded DRAM (eDRAM), SRAM, or spin-transfer torque memory (STT-M RAM).

The computing device 1100 may include other components that may or may not be physically and electrically coupled to the motherboard or fabricated within an SoC die. These other components include, but are not limited to, volatile memory 1110 (e.g., DRAM), nonvolatile memory 1112 (e.g., ROM or flash memory), a graphics processing unit 1114 (GPU), a digital signal processor 1116, a crypto processor 1142 (e.g., a specialized processor that executes cryptographic algorithms within hardware), a chipset 1120, at least one antenna 1122 (in some implementations two or more antennas may be used), a display or a touchscreen display 1124, a touchscreen controller 1126, a battery 1129 or other power source, a power amplifier (not shown), a voltage regulator (not shown), a global positioning system (GPS) device 1128, a compass 1130, a motion coprocessor or sensors 1132 (that may include an accelerometer, a gyroscope, and a compass), a microphone (not shown), a speaker 1134, a camera 1136, user input devices 1138 (such as a keyboard, mouse, stylus, and touchpad), and a mass storage device 1140 (such as hard disk drive, compact disk (CD), digital versatile disk (DVD), and so forth). The computing device 1100 may incorporate further transmission, telecommunication, or radio functionality not already described herein. In some implementations, the computing device 1100 includes a radio that is used to communicate over a distance by modulating and radiating electromagnetic waves in air or space. In further implementations, the computing device 1100 includes a transmitter and a receiver (or a transceiver) that is used to communicate over a distance by modulating and radiating electromagnetic waves in air or space.

The communications logic unit 1108 enables wireless communications for the transfer of data to and from the computing device 1100. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not. The communications logic unit 1108 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Infrared (IR), Near Field Communication (NFC), Bluetooth, derivatives thereof, as well as any other wireless protocols that are designated as 3G, 4G, 5G, and beyond. The computing device 1100 may include a plurality of communications logic units 1108. For instance, a first communications logic unit 1108 may be dedicated to shorter range wireless communications such as Wi-Fi, NFC, and Bluetooth and a second communications logic unit 1108 may be dedicated to longer range wireless communications such as GPS, EDGE, GPRS, CDMA, WiMAX, LTE, Ev-DO, and others.

The processor 1104 of the computing device 1100 includes one or more FinFET transistors in accordance with embodiments described herein. The term "processor" may refer to any device or portion of a device that processes electronic data from registers and/or memory to transform that electronic data into other electronic data that may be stored in registers and/or memory.

The communications logic unit 1108 may also include one or more FinFET transistors in accordance with embodiments described herein.

In further embodiments, another component housed within the computing device 1100 may contain one or more FinFET transistors in accordance with embodiments described herein.

In various embodiments, the computing device 1100 may be a laptop computer, a netbook computer, a notebook computer, an ultrabook computer, a smartphone, a dumbphone, a tablet, a tablet/laptop hybrid, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1100 may be any other electronic device that processes data.

EXAMPLES

The following is a list of example embodiments that fall within the scope of the disclosure. In order to avoid complexity in providing the disclosure, not all of the examples listed below are separately and explicitly disclosed as having been contemplated herein as combinable with all of the others of the examples listed below and other embodiments disclosed hereinabove. Unless one of ordinary skill in the art would understand that these examples listed below, and the above disclosed embodiments, are not combinable, it is contemplated within the scope of the disclosure that such examples and embodiments are combinable.

Example 1

A transistor including: a source region located on a first side of a substrate; a drain region located on the first side of the substrate; a semiconductor fin coupling the source region to the drain region, the semiconductor fin having a first portion located near the first side of the substrate and a second portion located near a second side of the substrate, wherein the first and the second sides of the substrate are opposite each other; a spacer at least partially surrounding the second portion of the semiconductor fin and extending out from the semiconductor fin a first distance; and a gate region at least partially surrounding the first portion of the semiconductor fin, the gate region having a T-shaped cross-section with a wider portion and a narrower portion, the wider portion of the gate region being located nearer an end of the first portion of the semiconductor fin than the narrower portion.

Example 2

The transistor of example 1, wherein the narrower portion extends out from the semiconductor fin the first distance as defined by the spacer, and the wider portion extends away from the semiconductor fin further than the first distance.

Example 3

The transistor according to any one of examples 1-2, wherein the wider portion of the gate region is contiguous with the first portion of the semiconductor fin at the end of the first portion.

Example 4

The transistor according to any one of examples 1-3, wherein the first distance is between three (3) and ten (10) nanometers.

Example 5

The transistor according to any one of examples 1-4, wherein the source region and the drain region include the same material as the semiconductor fin.

Example 6

The transistor according to any one of examples 1-5, further including a contact at least partially surrounding the source having a T-shaped cross-section.

Example 7

The transistor according to any one of examples 1-6, wherein the spacer includes silicon nitride.

Example 8

The transistor according to any one of examples 1-7, wherein the spacer includes silicon carbide.

Example 9

A method including: forming at least one FinFET transistor on a first side of a wafer, the FinFET transistor including a source, a drain, a fin, and a gate, the gate at least partially surrounding the fin at a proximal portion and extending out from the fin a first distance; removing a first portion of a second side of the wafer to expose a distal portion of a fin of the FinFET transistor, wherein the first and the second sides of the wafer are opposite each other; forming a spacer around the distal portion of the fin, the spacer extending out from the fin a second distance, wherein the second distance is less than the first distance; and removing a second portion of the second side of the wafer and a portion of the gate, wherein the portion of the gate removed is defined by the spacer.

Example 10

The method of example 9, wherein removing the first portion of the second side, the second portion of the second side, and the portion of the gate includes etching.

Example 11

The method according to any one of examples 9-10, wherein removing the second portion of the second side of the wafer and the portion of the gate includes performing a timed etch, wherein the timed etch is configured to stop when the end of the proximal portion of the fin is reached.

Example 12

The method according to any one of examples 9-11, further including subjecting the wafer to a low-temperature anneal to reduce surface fixed charge.

Example 13

The method according to any one of examples 9-12, further including refilling the removed first and second portions of the second side.

Example 14

The method according to any one of examples 9-13, wherein forming a spacer includes forming an etch resistant spacer.

Example 15

The method according to any one of examples 9-14, wherein forming a spacer includes forming the spacer to extend out from the fin between three (3) and ten (10) nanometers.

Example 16

A computing device including one or more transistors, each of the one or more transistors including: a source region located on a first side of a substrate; a drain region located on the first side of the substrate; a semiconductor region configured as a channel coupling the source electrode to the drain electrode, the semiconductor region forming a fin with a distal portion of the fin protruding from the first side of the substrate and a proximal portion of the fin located near a second side of the substrate, wherein the first and the second sides of the substrate are opposite each other; and an electrically conductive material at least partially surrounding the distal portion of the semiconductor region, the electrically conductive material having a first section and a second section, the first section located nearer an end of the distal portion of the semiconductor region than the second section, and the first section extending out from the semiconductor region further than the second section.

Example 17

The computing device of example 16, further including: a processor mounted on the substrate; a memory unit capable of storing data; a graphics processing unit; an antenna within the computing device; a display on the computing device; a battery within the computing device; a power amplifier within the processor; and a voltage regulator within the processor; wherein at least one of the processor, the memory unit, the graphics processing unit, or the voltage regulator includes the one or more transistors.

Example 18

The computing device according to any one of example 16-17, further including an etch-resistant material at least partially surrounding the proximal portion of the semiconductor region.

Example 19

The computing device according to any one of examples 16-18, wherein the proximal portion of the semiconductor region protrudes from the second side of the substrate.

Example 20

The computing device according to any one of examples 16-19, further including a gap-fill dielectric material at least partially surrounding the proximal portion of the semiconductor region.

Example 21

A method of manufacturing a transistor including: forming a source region located on a first side of a substrate; forming a drain region located on the first side of the substrate; forming a semiconductor fin coupling the source region to the drain region, the semiconductor fin having a first portion located near the first side of the substrate and a second portion located near a second side of the substrate, wherein the first and the second sides of the substrate are opposite each other; forming a spacer at least partially surrounding the second portion of the semiconductor fin and extending out from the semiconductor fin a first distance; and forming a gate region at least partially surrounding the first portion of the semiconductor fin, the gate region having a T-shaped cross-section with a wider portion and a narrower portion, the wider portion of the gate region being located nearer an end of the first portion of the semiconductor fin than the narrower portion.

Example 22

The method of example 21, wherein forming the gate region includes forming the narrower portion to extend out from the semiconductor fin the first distance as defined by the spacer, and forming the wider portion to extend away from the semiconductor fin further than the first distance.

Example 23

The method according to any one of examples 21-22, wherein forming the gate region includes positioning the wider portion of the gate region contiguous with the first portion of the semiconductor fin at the end of the first portion.

Example 24

The method according to any one of examples 21-23, wherein forming the spacer includes forming a spacer where the first distance is between three (3) and ten (10) nanometers.

Example 25

The method according to any one of example 21-24, wherein forming the source region, the drain and the semiconductor fin is done with the same material.

Example 26

The method according to any one of examples 21-25, further including forming a contact at least partially surrounding the source having a T-shaped cross-section.

Example 27

The method according to any one of examples 21-26, wherein forming the spacer includes forming a spacer including silicon nitride.

Example 28

The method according to any one of examples 21-27, wherein forming the spacer includes forming a spacer including silicon carbide.

Example 29

An apparatus including: at least one FinFET transistor on a first side of a wafer, the FinFET transistor including a source, a drain, a fin, and a gate, the gate at least partially surrounding the fin at a proximal portion and extending out from the fin a first distance; a distal portion of a fin of the FinFET transistor on a second side of the wafer, wherein the distal portion of the fin is exposed by removing a first portion of the second side, and wherein the first and the second sides of the wafer are opposite each other; a spacer around the distal portion of the fin, the spacer extending out from the fin a second distance, wherein the second distance is less than the first distance, wherein a second portion of the second side of the wafer and a portion of the gate is removed, and wherein the portion of the gate removed is defined by the spacer.

Example 30

The apparatus of example 29, wherein the first portion of the second side, the second portion of the second side, and the portion of the gate are removed via etching.

Example 31

The apparatus according to any one of examples 29-30, wherein the second portion of the second side of the wafer and the portion of the gate are removed via a timed etch, wherein the timed etch is configured to stop when the end of the proximal portion of the fin is reached.

Example 32

The apparatus according to any one of examples 29-31, wherein the wafer is subjected to a low-temperature anneal to reduce surface fixed charge.

Example 33

The apparatus according to any one of examples 29-32, further including a gap-fill dielectric material deposited in the removed first and second portions of the second side.

Example 34

The apparatus according to any one of examples 29-33, wherein the spacer includes an etch resistant material.

Example 35

The apparatus according to any one of examples 29-34, wherein the spacer extends out from the fin between three (3) and ten (10) nanometers.

Example 36

A method of operating a computing device including one or more transistors, the method including: applying a source potential to a source region located on a first side of a substrate; applying a drain potential to a drain region located on the first side of the substrate, wherein a semiconductor region couples the source electrode to the drain electrode, the semiconductor region forming a fin with a distal portion of the fin protruding from the first side of the substrate and a proximal portion of the fin located near a second side of the substrate, wherein the first and the second sides of the substrate are opposite each other; and applying a gate voltage to an electrically conductive material at least partially surrounding the distal portion of the semiconductor region, the electrically conductive material having a first section and a second section, the first section located nearer an end of the distal portion of the semiconductor region than the second section, and the first section extending out from the semiconductor region further than the second section.

Example 37

The method of example 36, wherein applying a gate voltage includes applying a gate voltage to electrically conductive material that at least partially surrounds a fin with a proximal portion at least partially surrounded by an etch-resistant material.

Example 38

The method according to any one of examples 36-37, wherein applying a gate voltage includes applying a gate voltage to electrically conductive material that at least partially surrounds a fin with a proximal portion protruding from the second side of the substrate.

Example 39

The method according to any one of examples 36-38, wherein applying a gate voltage includes applying a gate voltage to electrically conductive material that at least partially surrounds a fin with a proximal portion at least partially surrounded by gap-fill dielectric material.

Example 40

A means for performing at least a portion of the method according to any one of examples 9-15, 21-28, and 36-39.

Example 41

A computer-readable storage medium including computer-readable instructions stored thereon, the computer-readable instructions configured to instruct a processor to perform at least a portion of the method according to any one of examples 9-15, 21-28, and 36-39.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

It will be apparent to those having skill in the art that many changes may be made to the details of the above-described embodiments without departing from the underlying principles of the disclosure. The scope of the disclosure should, therefore, be determined only by the following claims.

The invention claimed is:

1. A transistor comprising:
   a source region located on a first side of a substrate;
   a drain region located on the first side of the substrate;
   a semiconductor fin coupling the source region to the drain region, the semiconductor fin having a first portion located near the first side of the substrate and a second portion located near a second side of the substrate, wherein the first and the second sides of the substrate are opposite each other;
   a spacer at least partially surrounding the second portion of the semiconductor fin and extending out from the semiconductor fin a first distance; and
   a gate at least partially surrounding the first portion of the semiconductor fin, the gate having a T-shaped cross-section with a wider portion and a narrower portion, the wider portion of the gate being located nearer an end of the first portion of the semiconductor fin than the narrower portion.

2. The transistor of claim 1, wherein the narrower portion extends out from the semiconductor fin the first distance as defined by the spacer, and the wider portion extends away from the semiconductor fin further than the first distance.

3. The transistor of claim 1, wherein the wider portion of the gate is contiguous with the first portion of the semiconductor fin at the end of the first portion.

4. The transistor of claim 1, wherein the first distance is between three (3) and ten (10) nanometers.

5. The transistor of claim 1, wherein the source region and the drain region comprise the same material as the semiconductor fin.

6. The transistor of claim 1, further comprising a contact at least partially surrounding the source having a T-shaped cross-section.

7. The transistor of claim 1, wherein the spacer comprises silicon nitride.

8. The transistor of claim 1, wherein the spacer comprises silicon carbide.

9. A method comprising:
   forming at least one FinFET transistor on a first side of a wafer, the FinFET transistor comprising a source, a drain, a fin, and a gate, the gate at least partially surrounding the fin at a proximal portion and extending out from the fin a first distance;
   removing a first portion of a second side of the wafer to expose a distal portion of the fin of the FinFET transistor, wherein the first and the second sides of the wafer are opposite each other;
   forming a spacer around the distal portion of the fin, the spacer extending out from the fin a second distance, wherein the second distance is less than the first distance; and
   removing a second portion of the second side of the wafer and a portion of the gate, wherein the portion of the gate removed is defined by the spacer.

10. The method of claim 9, wherein removing the first portion of the second side, the second portion of the second side, and the portion of the gate comprises etching.

11. The method of claim 9, wherein removing the second portion of the second side of the wafer and the portion of the gate comprises performing a timed etch, wherein the timed etch is configured to stop when the end of the proximal portion of the fin is reached.

12. The method of claim 9, further comprising subjecting the wafer to a low-temperature anneal to reduce surface fixed charge.

13. The method of claim 9, further comprising refilling the removed first and second portions of the second side.

14. The method of claim 9, wherein forming a spacer comprises forming an etch resistant spacer.

15. The method of claim 9, wherein forming a spacer comprises forming the spacer to extend out from the fin between three (3) and ten (10) nanometers.

16. A computing device comprising one or more transistors, each of the one or more transistors comprising:
   a source region located on a first side of a substrate;
   a drain region located on the first side of the substrate;
   a semiconductor region configured as a channel coupling the source region to the drain region, the semiconductor region forming a fin with a distal portion of the fin located near the first side of the substrate and a proximal portion of the fin located near a second side of the substrate, wherein the first and the second sides of the substrate are opposite each other; and
   an electrically conductive material at least partially surrounding the distal portion of the fin, the electrically conductive material having a T-shaped cross-section with a wider portion and a narrower portion, the wider portion of the electrically conductive material being located nearer an end of the distal portion of the fin than the narrower portion.

17. The computing device of claim 16, further comprising:
   a processor mounted on the substrate;
   a memory unit capable of storing data;

a graphics processing unit;
an antenna within the computing device;
a display on the computing device;
a battery within the computing device;
a power amplifier within the processor; and
a voltage regulator within the processor;
wherein at least one of the processor, the memory unit, the graphics processing unit, or the voltage regulator comprises the one or more transistors.

18. The computing device of claim 16, further comprising an etch-resistant material at least partially surrounding the proximal portion of the semiconductor region.

19. The computing device of claim 16, wherein the proximal portion of the semiconductor region protrudes from the second side of the substrate.

20. The computing device of claim 16, further comprising a gap-fill dielectric material at least partially surrounding the proximal portion of the semiconductor region.

* * * * *